United States Patent [19]
Rigney et al.

[11] Patent Number: 5,350,599
[45] Date of Patent: Sep. 27, 1994

[54] EROSION-RESISTANT THERMAL BARRIER COATING

[75] Inventors: David V. Rigney, Cincinnati; Robert W. Bruce; Antonio F. Maricocchi, both of Loveland, all of Ohio

[73] Assignee: General Electric Company, Cincinnati, Ohio

[21] Appl. No.: 966,911

[22] Filed: Oct. 27, 1992

[51] Int. Cl.⁵ .............................................. C23C 16/00
[52] U.S. Cl. .................. 427/255.7; 427/419.3
[58] Field of Search .................. 415/200; 416/241 B; 427/248.1, 255.7, 255.3, 419.3

[56] References Cited

U.S. PATENT DOCUMENTS

| | | |
|---|---|---|
| 3,093,503 | 6/1963 | Laszlo . |
| 3,113,885 | 12/1963 | Teague . |
| 3,978,253 | 8/1976 | Sahm . |
| 4,288,495 | 9/1981 | Terner et al. . |
| 4,303,693 | 12/1981 | Driver . |
| 4,405,659 | 9/1983 | Strangman ........................ 427/248.1 |
| 4,676,994 | 6/1987 | Demaray ........................... 427/248.1 |
| 4,880,614 | 11/1989 | Strangman et al. .............. 427/248.1 |
| 4,904,542 | 2/1990 | Mroczkowski ................... 416/241 B |
| 4,916,022 | 4/1990 | Solfest et al. .................... 416/241 B |

Primary Examiner—Edward K. Look
Assistant Examiner—Christopher Verdier
Attorney, Agent, or Firm—Jerome C. Squillaro; David L. Narciso

[57] ABSTRACT

An article is protected by a thermal barrier coating system. The article includes a substrate having an outer surface and a thermal barrier coating system deposited upon the substrate. The thermal barrier coating system includes a porous region wherein the ceramic is present as a porosity-containing columnar grain structure extending substantially perpendicular to the substrate surface, and an erosion-resistant densified region overlying the porous region. The thermal barrier coating is preferably applied by rotating the substrate past a deposition source to deposit the columnar grains, and then halting or slowing the rotation while continuing the deposition of the erosion-resistant region.

8 Claims, 3 Drawing Sheets

EROSION-RESISTANT THERMAL BARRIER COATING

BACKGROUND

This invention is related to articles such as gas turbine blades and vanes protected by thermal barrier coating systems, and, more particularly, to modification of the thermal barrier coating for improved erosion resistance.

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of hot gas turns the turbine, which turns the shaft and provides power to the compressor. The hot exhaust gases then flow from the back of the engine, driving it and the aircraft forward.

The hotter the exhaust gases, the more efficient is the operation of the jet engine. There is thus an incentive to raise the exhaust gas temperature. However, the maximum temperature of the exhaust gases is normally limited by the materials used to fabricate the turbine vanes and turbine blades of the turbine. In current engines, the turbine vanes and blades are made of nickel-base superalloys, and can operate at temperatures of up to 1900°–2100° F.

Many approaches have been used to increase the operating temperature limit of the turbine blades and vanes. The composition and processing of the materials themselves have been improved. Physical cooling techniques are used. In one widely used approach, internal cooling channels are provided within the components, and cool air is forced through the channels during engine operation. In another approach, a thermal barrier coating system is applied to the turbine blade or turbine vane, which includes internal cooling channels in its design, which acts as a substrate. The thermal barrier coating system includes a ceramic thermal barrier coating that insulates the component from the hot exhaust gas, permitting the exhaust gas to be hotter than would otherwise be possible with the particular material and fabrication process of the component. Ceramic thermal barrier coatings usually do not adhere well directly to the superalloys used in the substrates, and therefore an additional layer called a bond coat is placed between the substrate and the thermal barrier coating. The bond coat improves the adhesion, and, depending upon its composition and processing, may also serve as a diffusion barrier to prevent oxidation and corrosion damage of the substrate.

The use of thermal barrier coating systems increases the operating temperature of the protected component, and its environmental resistance. Erosion, another damage mode found in the gas turbine engine, has consequently become more significant as the life-limiting cause of failure of the protected components. The thermal barrier coating systems have relatively poor resistance to erosion by small particles that are generated in, or pass through, the combustor. These small particles impinge against the protected component, and can either gradually wear through the thermal barrier coating (typically if the particles are small) or cause it to chip and flake away (typically if the particles are large). Once the thermal barrier coating is removed in localized regions, the component may fail because those regions may then be exposed to temperatures above the maximum acceptable service temperature of the component's material.

There is a need to improve the erosion resistance of thermal barrier coating systems. The approach to improving erosion resistance must be compatible with existing techniques and cannot add significantly to the weight of the component. The present invention fulfills this need, and further provides related advantages.

SUMMARY OF THE INVENTION

The present invention provides an improved thermal barrier coating system and articles protected by the system. The thermal barrier coating system has a hardened, more resistant exterior layer of the thermal barrier coating that is more resistant to erosion damage than is the underlying portion of the thermal barrier coating. However, the underlying portion of the thermal barrier coating retains a structure that imparts excellent resistance to stresses and strains induced by thermal cycling. The thermal barrier coating continues to perform the function of insulating the underlying substrate from the hot gas temperatures. The modified thermal barrier coating is compatible with, and is typically used with, a bond coat, which provides good resistance to oxidation and other diffusion-originating damage to the underlying substrate. It is not necessarily heavier than prior thermal barrier coatings. The resulting thermal barrier coating system combines excellent protection against hot gas temperatures, environmental resistance, thermal cycling resistance, and erosion resistance.

In accordance with the invention, an article protected by a thermal barrier coating system comprises a substrate having a substrate surface and a thermal barrier coating system deposited upon the substrate. In the preferred approach, the substrate article which is protected is a nickel-based superalloy turbine blade or vane; however, this invention is not restricted to such substrates and may be utilized on many other substrates requiring thermal barrier protection, including other components of gas turbine engines exposed to high temperature gases in which the substrate material is selected from the group of engineered materials consisting of cobalt-based superalloys, titanium-based superalloys including both gamma TiAl and forms of Ti$_3$Al, aluminum-based alloys, nickel aluminides including NiAl, alumina fiber/alumina silicate matrix composites, silicon carbide fiber/silicon carbide matrix composites, alumina fiber/refractory metal matrix composites, alumina fiber/MCrAlY matrix composites, refractory metal fiber/MCrAlY matrix composites, alumina fiber/NiAl matrix composites, silicon carbide fiber/gamma TiAl matrix composites, refractory metal fiber/NiAl matrix composites, carbon fiber/carbon matrix composites, alumina fiber/TiAl alloy matrix composites, silicon carbide fiber/alumina matrix composites, silicon carbide fiber/silicon nitride matrix composites and other materials systems. The thermal barrier coating system comprises an optional bond coat and a ceramic thermal barrier coating having a porous region, wherein the ceramic is present as porosity-containing columnar grains extending substantially perpendicular to the substrate surface, and an erosion-resistant densified region overlying the porous region. The porous region thus has a banded structure. Further alternating regions of porous and dense ceramic material may be added overlying these regions.

The thermal barrier coating system is produced by depositing a bond coat, where used, onto the substrate and compatible with it, and depositing the ceramic material onto the substrate or bond coat. In a preferred approach, the substrate is placed on a rotating stage adjacent a deposition source. The columnar region is deposited by rotating the substrate, and, simultaneously while rotating the substrate, depositing ceramic from the deposition source as a first region. The erosion-resistant region is deposited by substantially slowing the rotating motion or even halting the rotating motion, and then depositing ceramic from the deposition source in a second region overlying the first region. Alternatively, the second region may be obtained by increasing the temperature during the deposition step.

The preferred thermal barrier coating system has a bond coat deposited upon the substrate. The bond coat forms an aluminum oxide surface scale during exposure to oxygen-containing atmospheres at elevated temperatures. The bond coat may be simple, or have a complex, multilayer structure. The ceramic thermal barrier coating overlies the bond coat. The thermal barrier coating has at least two regions or layers, both of ceramic material, and preferably the same ceramic material. The region closest to the substrate, in contact with the bond coat, has a columnar, somewhat porous structure produced by intermittent physical vapor deposition coating. The intermittent deposition is preferably accomplished by rotating the substrate past the deposition source, so that ceramic is deposited while the substrate faces the deposition source, and not deposited, or only minimally deposited, when the substrate faces away from the deposition source. This approach is known in the art to produce a columnar structure whose columnar grains are oriented generally perpendicular to the surface of the substrate.

The dense, erosion-resistant region of the thermal barrier coating is preferably of the same ceramic material and is deposited on top of the columnar region. This erosion-resistant region is preferably deposited by halting the rotation of the substrate with the surface being protected facing the deposition source. Deposition is continued, at a higher surface temperature because there is no cooling period for the area upon which the deposition is occurring. It is observed that the deposited region is less columnar and denser, and thence more resistant to erosion, than the columnar region.

Both the porous region and the dense region provide thermal insulation to the underlying substrate, as both are ceramics. The porous region, in contact with the metallic bond coat or substrate, mitigates thermal cycling stresses and strains arising between the ceramic and the metallic substrate due to their different coefficients of thermal expansion. The porous structure does not have good erosion resistance, however. The dense region overlying the columnar structure is much more erosion resistant, and therefore protects the underlying porous structure and the substrate against erosion damage. This duplex structure therefore affords good erosion resistance and protection against the high temperature of the hot gas stream. The duplex structure is itself resistant to thermal shock and spalling failure due to the porous region.

The dense layer also reduces the formation of glassy deposits during service, which may then intrude between columns in the ceramic coating structure. Such intrusions are thought to contribute to the breakup of the ceramic during thermal cycling during service.

The present invention provides an important advance in the art of protection of gas turbine components with thermal barrier coating systems. The approach of the invention retains the features of prior thermal barrier coating systems, but adds improved erosion resistance. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
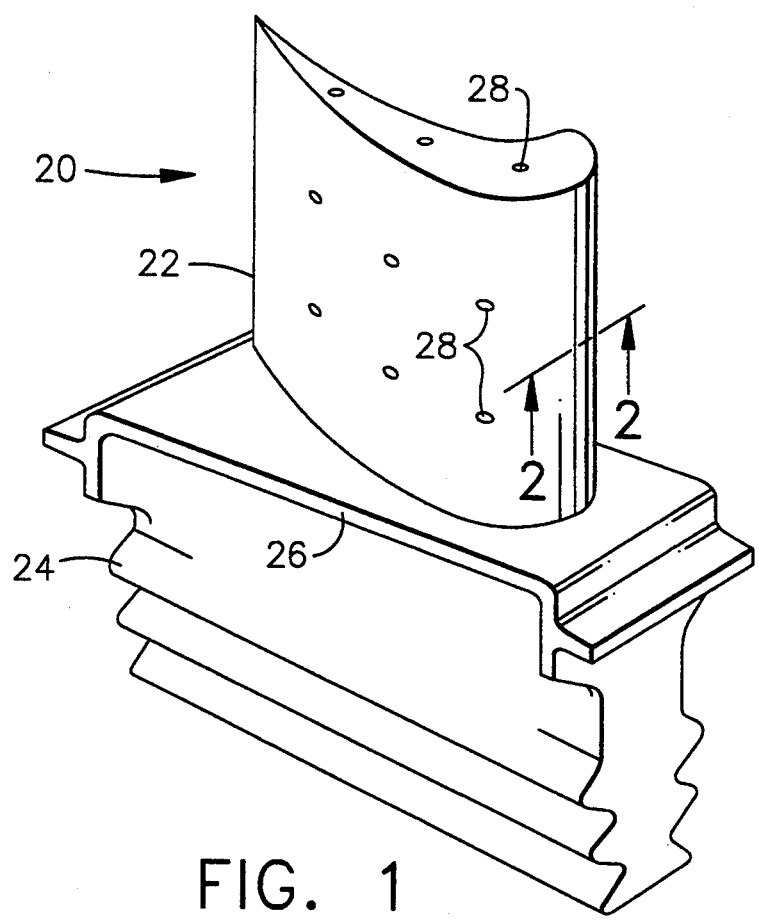
FIG. 1 is a perspective view of a gas turbine component.

FIG. 1 depicts a component of a gas turbine engine such as a turbine blade or turbine vane, in this case a turbine blade 20 made of a nickel-base superalloy. The turbine blade 20 includes an airfoil 22 against which the flow of hot exhaust gas is directed. The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of cooling channels (not shown) desirably extend through the interior of the airfoil 22, ending in openings 28 in the surface of the airfoil 22. A flow of cooling air is directed through the cooling channels, to reduce the temperature of the airfoil 22.

Figure 2:
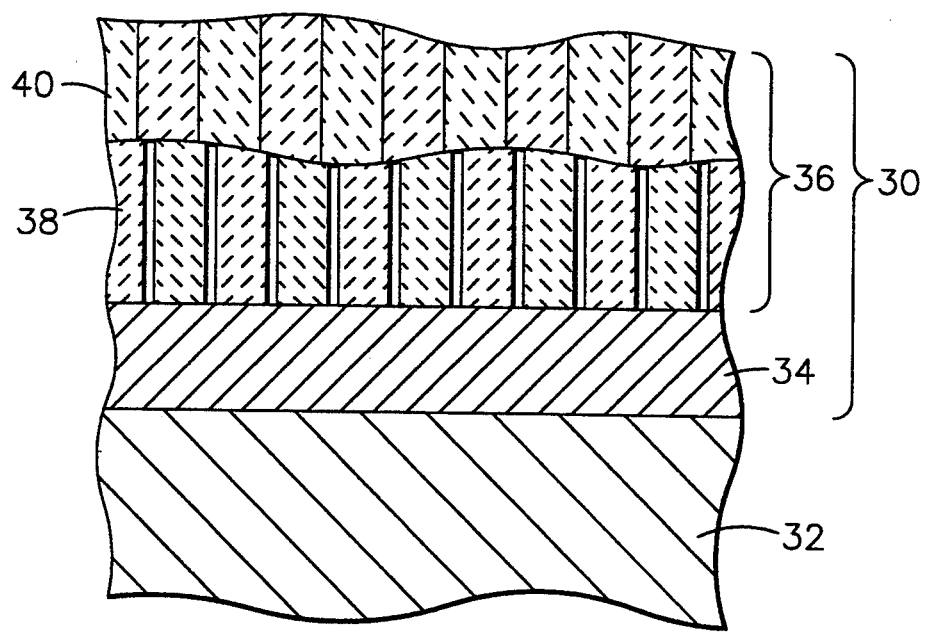
FIG. 2 is a sectional view through the component of FIG. 1, taken generally along line 2—2, illustrating a thermal barrier coating system on the surface of the component.

The airfoil 22 of the turbine blade 20 is protected by a thermal barrier coating system 30, illustrated in FIG. 2. The thermal barrier coating system 30 is deposited upon the turbine blade 20, which becomes a substrate 32 for the thermal barrier coating system 30. The thermal barrier coating system 30 preferably includes a bond coat layer 34 and a thermal barrier coating 36, i.e., the thermal barrier coating "system" includes both the thermal barrier coating and the bond coat.

The bond coat layer 34 is deposited upon the substrate 32. The bond coat is preferably from about 0.001 to about 0.008 inches thick, and is formed of a nickel-base alloy of different composition than the airfoil 22. A preferred nickel-base alloy is that disclosed in U.S. Pat. No. 5,043,138, whose disclosure is incorporated by reference. This alloy, known as BC51, has a nominal composition in weight percent, as set forth in the '138 patent, of 1-10 percent cobalt, 6-12 percent chromium, 5-8 percent aluminum, 1-10 percent tantalum, 1-10 percent tungsten, 0-3 percent rhenium, 1-2 percent molybdenum, 0.1-2 percent hafnium, 0.005-0.1 percent boron, 0.005-0.25 percent carbon, 0.001-1.0 percent yttrium, balance nickel and incidental impurities.

There may also sometimes be deposited sublayers within the bond coat, such as an aluminide layer of NiAl or PtAl or an MCrAlY where M is an element selected from the group consisting of Ni, Co and combinations thereof. If desired, the bond coat may comprise such an aluminide layer. The term "bond coat" as used herein is intended to cover such modifications and refinements of the basic bond coat structure, as is well known in the art.

The thermal barrier coating layer 36 overlies the bond coat layer 34. The thermal barrier coating layer 36 is formed of a ceramic material that serves to insulate the substrate 32 from the temperature of the hot exhaust gas passing over the surface of the airfoil 22 when the engine is in service. The thermal barrier coating layer 36 may be any acceptable material, but desirably is yttria-stabilized zirconia, having a composition of from about 7 to about 20 weight percent yttrium oxide, balance zirconium oxide. The thermal barrier coating 36 is typically from about 0.002 to about 0.012 inches thick.

The thermal barrier coating layer 36 has at least two sublayers. The first sublayer is a porous region 38 deposited onto the bond coat 34. The ceramic material of the porous region 38 is present in side-by-side columns that grow generally perpendicularly to the surface of the substrate 32 and the bond coat 34. The porous region 38 naturally contains some degree of lateral spacing between the columns and some degree of internal porosity within each column. The spacing and porosity are desirable in reducing the effects of stresses and strains induced when the protected article is repeatedly heated and cooled during service. This same porous structure, however, leads to a relatively low erosion resistance of the region 38, when exposed to and in contact with the hot gas, particulate-containing environment of the gas turbine engine.

The second sublayer is a denser, erosion-resistant region 40 that overlies the porous region 38. The ceramic of the region 40 has less porosity (preferably nearly no porosity) and is therefore more dense than that of the porous region 38. The ceramic of the region 40 does not exhibit the porosity or the lateral spacing of porous region 38.

Figure 3:
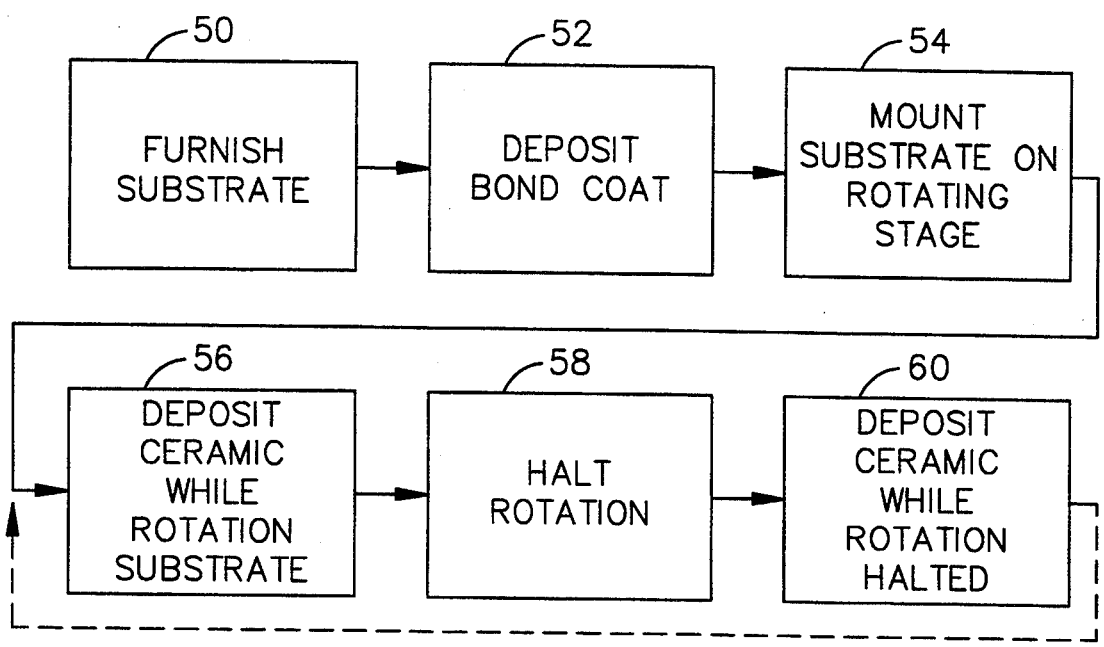
FIG. 3 is a block diagram of a preferred approach for practicing the invention.

A process for preparing a component such as the just-described turbine blade 20 protected by the thermal barrier coating system 30 is illustrated in FIG. 3.

First, the turbine blade 20, whose airfoil 22 becomes the substrate 32, is fabricated by conventional techniques, as indicated at numeral 50. In the approach preferred in the industry, the turbine blade 20 is a nickel-base superalloy made from a single crystal that is oriented with a selected crystallographic direction (typically [001]) parallel to the long axis of the airfoil 22, which is the principal stress direction when the turbine blade 20 is in service. Alternatively, the turbine blade 20 may be made polycrystalline with the individual crystals oriented to have the same selected direction parallel to the long axis of the airfoil 22. Techniques for growing oriented single crystals and polycrystals, and for manufacturing cast turbine blades and vanes, are well known in the art.

The bond coat is next deposited by any appropriate technique, numeral 52, and such techniques are known in the art. The preferred BC51 bond coat is prepared by low pressure plasma spray, as described in U.S. Pat. No. 5,043,138.

Figure 4:
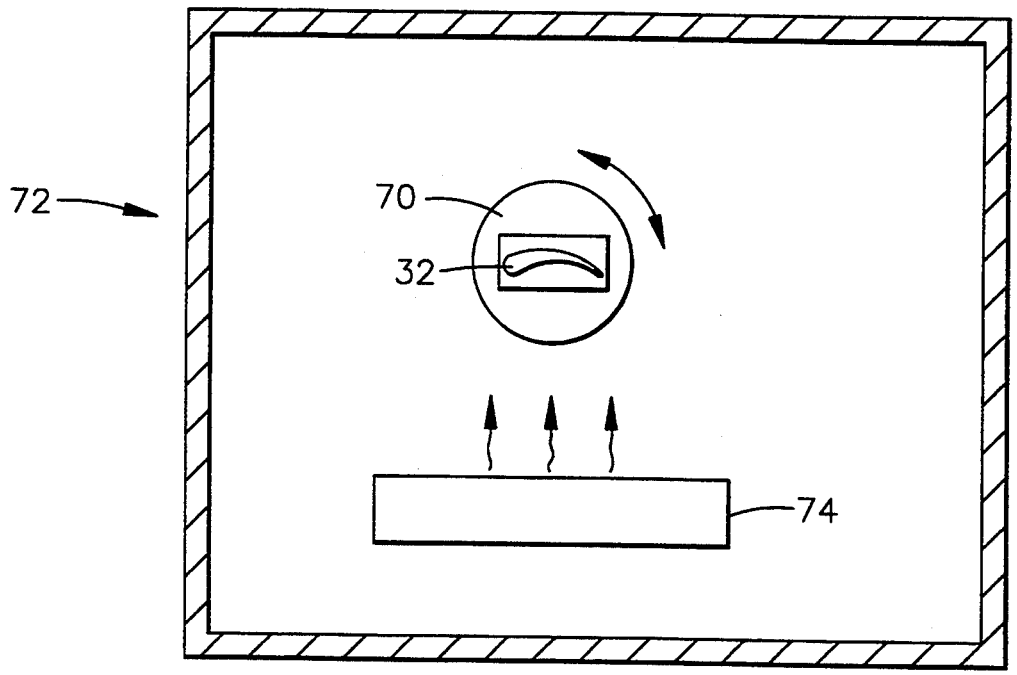
FIG. 4 is a schematic view of an apparatus for depositing the thermal barrier coating.

The substrate 32, with the deposited bond coat 34, is mounted in a rotating stage 70 of a ceramic deposition apparatus 72, numeral 54. The apparatus 72, shown schematically in FIG. 4, has a deposition source 74, from which the ceramic is deposited. The preferred deposition source is a physical vapor deposition source. The rotating stage 70 supports the substrate 32 adjacent the deposition source 74, so that it can be rotated to deposit ceramic first on one side of the substrate and then on the other side of the substrate.

To deposit the porous region 38, the ceramic is deposited from the source 74 onto the substrate 32 while the stage 70 is operated to rotate the substrate continuously at a first rotational speed, numeral 56 of FIG. 3. The deposition on a particular area continues for a period of time while the particular area is in a line of sight with the source 74, and then interrupted for a period of time while the particular area is out of line of sight with the source 74. While the deposition is briefly interrupted, the deposited ceramic cools somewhat. This intermittent cooling and then subsequent further deposition leads to the porous structure characteristic of the porous region 38. In the preferred approach, the rate of rotation of the substrate is about 5 to about 60 rpm (revolutions per minute).

When a sufficient thickness of the porous region 38 is deposited, the operation of the stage 70 is slowed to a second rotational speed slower than the first rotational speed or halted, numeral 58, with a particular area in line of sight with the source 74. The deposition of ceramic from the source 74 is continued, numeral 60, while the motion is substantially slowed or stopped. During this phase of the deposition, the just-deposited ceramic does not have the opportunity to cool, so that the ceramic being deposited is deposited onto a hotter base. The result is that the deposited ceramic is more dense than the porous region 38, producing the dense region 40. The ceramic material itself is of a generally similar character and composition in both the dense region 40 and the porous region 38.

The deposition of the duplex structure can be achieved by controlling the rotational speed of the article being coated. By continuously controlling the rotational speed, an instantaneous rotational speed can be achieved. This instantaneous rotational speed provides an instantaneous rate of material deposition and can control the deposition of the ceramic to provide a preselected structure having a preselected thickness at a preselected location on the substrate as desired.

The embodiment of FIGS. 2 and 3 has been successfully reproduced in practice. The substrate 32 was comprised of the well-known superalloy Rene'80, which has a nominal composition, in weight percent, of 14 % Cr, 9.5 % Co, 4 % Mo, 4 % W, 5 % Ti, 3 % Al, 0.015 % B, 0.03 % Zr, 0.15 % C, balance Ni and incidental impurities. The bond coat 34 was a layer of nickel aluminide about 0.0025 inches thick. The ceramic of the thermal barrier coating was zirconia-7.2 weight percent yttria, deposited by physical vapor deposition. The porous region 38 was deposited at a rotation rate of 10 rpm, to a thickness of about 0.005 inches. The dense region 40 was deposited with the substrate stationary, to a thickness of about 0.005 inches.

Figure 5:
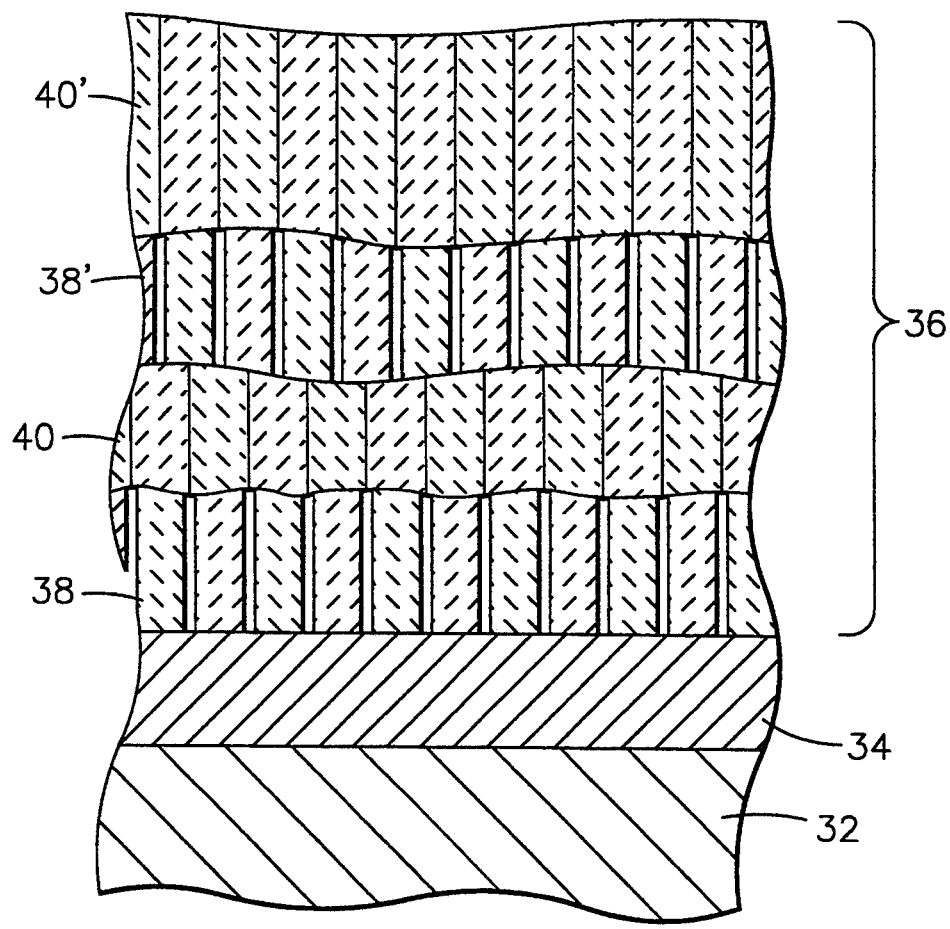
FIG. 5 is another embodiment of the thermal barrier coating system shown in FIG. 2.

Another embodiment of the invention is illustrated in FIG. 5, and the additional processing is indicated by the dashed arrow of FIG. 3. Here, the substrate 32 bond coat 34, porous region 38, and dense region 40 are deposited as before. Rotation is then restarted, and a further porous region 38' is deposited over the dense region 40, step 56 of FIG. 3. After a sufficient thickness of the porous region 38' is deposited, the rotation is halted, numeral 58. Deposition continues, and a further dense region 40' is deposited over the porous region 38'. This repetitive process may continue as for as many pairs of porous and dense layers as might be desirable.

The resulting structure has excellent erosion resistance, as well as good thermal insulation and environmental resistance. This invention has been described in connection with specific embodiments and examples. However, it will be readily recognized by those skilled in the art the various modifications and variations of which the present invention is capable without departing from its scope as represented by the appended claims.

What is claimed is:

1. A method for preparing an article protected by a thermal barrier coating system, comprising the steps of:

providing a substrate having an outer surface;

placing the substrate on a rotating stage adjacent a deposition source;

depositing the coating system comprising a ceramic thermal barrier coating upon the substrate surface from the deposition source by rotating the substrate at a first rotational speed so that deposition of the ceramic coating from the deposition source continues for a period of time on a particular area of the substrate while the particular area is in a line-of-sight with the deposition source, and so that deposition is interrupted while the particular area is out of the line-of-sight with the deposition source, so that the particular area is cooler when out of the line-of-sight, and, simultaneously with the rotating, depositing the ceramic from the deposition source as a first region on the substrate surface, and slowing the rotating to a second rotational speed, and, while the rotating is slowed, depositing the ceramic from the deposition source overlying the first region.

2. The method of claim 1, including the further step, prior to the step of rotating the substrate at the first rotational speed, of first depositing a bond coat onto the substrate surface.

3. The method of claim 1, wherein the step of slowing the rotating includes slowing the rotating to zero rotational speed, thereby halting the rotating.

4. The method of claim 3, including the further step, after the step of halting, of again rotating the substrate, and, simultaneously with the rotating, depositing the ceramic from the deposition source as a third region, and halting the rotating, and, while the rotating is halted, depositing the ceramic from the deposition source overlying the third region.

5. The method of claim 1, wherein the step of rotating is continuously controlled to achieve an instantaneous rotational speed consistent with deposition of the ceramic having a preselected structure and a preselected thickness at a preselected location on the substrate.

6. The method of claim 1, wherein the step of depositing the ceramic is continuously controlled to achieve an instantaneous rate of depositing consistent with deposition of the ceramic having a preselected structure and a preselected thickness at a preselected location on the substrate.

7. A method for preparing an article protected by a thermal barrier coating system comprising the steps of:

providing a substrate:

depositing the thermal barrier coating system upon the substrate by depositing a porous ceramic region intermittently, the porous region characterized by ceramic having porosity-containing columnar grains having lateral spacing between said columnar grains, the grains having a banded structure generally perpendicular to the surface of the substrate; and then depositing an erosion-resistant densified ceramic region substantially continuously overlying the porous ceramic region, the densified region being characterized by ceramic substantially free of porosity and substantially free of lateral spacing.

8. The method of claim 7 further including the step of first depositing a bond coat over the substrate prior to the step of depositing the porous ceramic region.

* * * * *